United States Patent
Nakagawa et al.

(10) Patent No.: US 11,072,153 B2
(45) Date of Patent: Jul. 27, 2021

(54) COMPOSITION AND LAMINATED BODY

(71) Applicant: DAIKIN INDUSTRIES, LTD., Osaka (JP)

(72) Inventors: Hideto Nakagawa, Osaka (JP); Hidenori Ozaki, Osaka (JP); Kenji Gobou, Osaka (JP); Koichiro Ogita, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/562,018

(22) PCT Filed: Mar. 29, 2016

(86) PCT No.: PCT/JP2016/060211
§ 371 (c)(1),
(2) Date: Sep. 27, 2017

(87) PCT Pub. No.: WO2016/158991
PCT Pub. Date: Oct. 6, 2016

(65) Prior Publication Data
US 2018/0086036 A1    Mar. 29, 2018

(30) Foreign Application Priority Data
Mar. 31, 2015  (JP) .............................. JP2015-073368

(51) Int. Cl.
*B32B 27/30* (2006.01)
*H01L 31/049* (2014.01)
(Continued)

(52) U.S. Cl.
CPC .............. *B32B 27/30* (2013.01); *C08L 27/14* (2013.01); *C08L 27/16* (2013.01); *C08L 47/00* (2013.01);
(Continued)

(58) Field of Classification Search
CPC ... H01L 31/049; B32B 27/30; B32B 2327/12; B32B 2457/12; C08L 27/14; C08L 27/16;
(Continued)

(56) References Cited

U.S. PATENT DOCUMENTS

| 2011/0083726 A1 | 4/2011 | Takayanagi et al. |
| 2013/0095326 A1* | 4/2013 | Tasaka ..................... C09D 4/06 |
| | | 428/413 |

(Continued)

FOREIGN PATENT DOCUMENTS

| CA | 2774964 A1 | 4/2011 |
| EP | 1 938 967 A1 | 7/2008 |

(Continued)

OTHER PUBLICATIONS

"OLESTER™ Acrylic Resin and Polyurethane Resin for Coating." Mitsui Chemicals, www.mitsuichem.com/en/service/packaging/coatings/olester/index.htm. Accessed: Jan. 30, 2019 (Year: 2019).*

(Continued)

*Primary Examiner* — Magali P Slawski
*Assistant Examiner* — Kourtney R S Carlson
(74) *Attorney, Agent, or Firm* — Sughrue Mion, PLLC

(57) ABSTRACT

The invention provides a novel composition capable of providing a film or coat exhibiting excellent adhesiveness to a water-impermeable sheet and to an EVA encapsulant layer even without corona discharge treatment. The composition of the invention contains a fluorine-containing polymer and a polyol compound having a hydroxyl value of 10 to 300. The polyol compound is contained in an amount of not less than 0.1 mass % but less than 100 mass % relative to the fluorine-containing polymer.

8 Claims, 1 Drawing Sheet

(51) Int. Cl.
| | |
|---|---|
| *C09D 201/04* | (2006.01) |
| *C08L 27/14* | (2006.01) |
| *C08L 27/16* | (2006.01) |
| *C08L 47/00* | (2006.01) |
| *C08L 69/00* | (2006.01) |
| *C08L 101/04* | (2006.01) |
| *C09D 7/40* | (2018.01) |
| *C08L 67/00* | (2006.01) |
| *C08L 71/00* | (2006.01) |
| *C09D 127/18* | (2006.01) |
| *C09D 127/12* | (2006.01) |
| *C09D 131/04* | (2006.01) |
| *C09D 127/14* | (2006.01) |
| *C09D 127/16* | (2006.01) |
| *C08L 67/02* | (2006.01) |

(52) U.S. Cl.
CPC ............ *C08L 67/00* (2013.01); *C08L 67/025* (2013.01); *C08L 69/00* (2013.01); *C08L 71/00* (2013.01); *C08L 101/04* (2013.01); *C09D 7/40* (2018.01); *C09D 127/12* (2013.01); *C09D 127/14* (2013.01); *C09D 127/16* (2013.01); *C09D 127/18* (2013.01); *C09D 131/04* (2013.01); *C09D 201/04* (2013.01); *H01L 31/049* (2014.12); *B32B 2327/12* (2013.01); *B32B 2457/12* (2013.01)

(58) Field of Classification Search
CPC .......... C08L 47/00; C08L 67/00; C08L 71/00; C09D 7/40; C09D 127/12; C09D 7/14; C09D 7/16; C09D 7/18; C09D 131/04; C09D 201/04
USPC .................................................. 136/242–265
See application file for complete search history.

(56) References Cited

U.S. PATENT DOCUMENTS

| | | | | |
|---|---|---|---|---|
| 2013/0340816 | A1* | 12/2013 | Kuriyama | ............... B32B 27/34 136/252 |
| 2014/0290743 | A1 | 10/2014 | Nakagawa et al. | |
| 2014/0318617 | A1 | 10/2014 | Nakagawa et al. | |
| 2015/0284585 | A1* | 10/2015 | Onishi | ................... C08F 220/14 428/412 |

FOREIGN PATENT DOCUMENTS

| | | | |
|---|---|---|---|
| EP | 2 532 721 | A1 | 12/2012 |
| EP | 2 792 485 | A1 | 10/2014 |
| JP | 3-243674 | A | 10/1991 |
| JP | 7-176775 | A | 7/1995 |
| JP | 8-295840 | A | 11/1996 |
| JP | 9-310041 | A | 12/1997 |
| JP | 10-219099 | A | 8/1998 |
| JP | 2004-214342 | A | 7/2004 |
| JP | 2013-117023 | A | 6/2013 |
| JP | 2013-136736 | A | 7/2013 |
| JP | 2014-136730 | A | 7/2014 |
| JP | 2015-147841 | A | 8/2015 |
| WO | 2007/010706 | A1 | 1/2007 |
| WO | 2009/157449 | A1 | 12/2009 |
| WO | 2013/054948 | A1 | 4/2013 |
| WO | WO-2013088943 | A1 * | 6/2013 ........... C09D 127/18 |
| WO | WO-2014097720 | A1 * | 6/2014 |

OTHER PUBLICATIONS

International Preliminary Report on Patentability with the translation of Written Opinion dated Oct. 3, 2017 issued by the International Bureau in international application No. PCT/JP2016/060211.
International Search Report for PCT/JP2016/060211 dated May 31, 2016 [PCT/ISA/210].
Communication dated Sep. 7, 2018 from the European Patent Office in counterpart Application No. 16772872.4.
Eist2271: "Olester Q type (Acrylic and Polyester polyol)—Grades", Aug. 31, 2009, XP055502432; Retrieved from the Internet: URL:https://www.mitsuichem.com/sites/default/files/media/document/2018/pict_spec002_0.pdf (retrieved on Aug. 27, 2018) (1 page total).
Wanqiang Zhu, "Basic Tutorial of Coating", Chengdu, Southwest Jiaotong University Press, 2012, ISBN 978-7-5643-1803-1 (8 pages total).

* cited by examiner

COMPOSITION AND LAMINATED BODY

CROSS REFERENCE TO RELATED APPLICATIONS

This application is a National Stage of International Application No. PCT/JP2016/060211, filed on Mar. 29, 2016, which claims priority from Japanese Patent Application No. 2015-073368, filed on Mar. 31, 2015, the contents of all of which are incorporated herein by reference in their entirety.

TECHNICAL FIELD

The invention relates to a composition containing a fluorine-containing polymer and a laminate including a layer formed from the composition.

BACKGROUND ART

Solar cell modules include a solar cell, an encapsulant layer that encapsulates the solar cell, a surface-protecting layer, and a back sheet. The encapsulant layer and the back sheet are preferably firmly bonded to each other. For back sheets including components such as a back-reinforcing material, a water-impermeable sheet, and a substrate sheet and a film, the components and the film need to be firmly bonded to each other. In order to achieve such bonding performance, some techniques are proposed.

Patent Literature 1 discloses a solar cell module including a solar cell embedded in a filler on a back-reinforcing material, wherein the surface of the back-reinforcing material in contact with the filler is coated with epoxy resin.

Patent Literature 2 discloses a solar cell substrate with excellent adhesiveness including a metal plate as a substrate and a film formed from a coating composition, wherein the coating composition contains a polyvinylidene fluoride-based fluororesin free from a functional group, and a tetraalkoxysilane or a partially hydrolyzed condensate of a tetraalkoxysilane in an amount of 0.5 to 100 parts by mass for each 100 parts by mass of the coating resin, and the partially hydrolyzed condensate of a tetraalkoxysilane is oriented to the film surface.

Patent Literature 3 discloses a back sheet for a solar cell module, including a water-impermeable sheet and, on at least one side of the water-impermeable sheet, a cured film formed from a fluorine-containing polymer coating containing a curable functional group.

Patent Literature 4 discloses a back sheet for a solar cell module, including a substrate sheet and, on one or both sides of the substrate sheet, a cured film layer formed from a coating containing a fluorine-containing polymer (A), wherein the polymer (A) contains a repeating unit based on a fluoroolefin (a), a repeating unit based on a crosslinkable group-containing monomer (b), and a repeating unit based on an alkyl-containing monomer (c) in which a C2-C20 linear or branched alkyl group free from a quaternary carbon atom and a polymerizable unsaturated group are linked via an ether bond or an ester bond.

CITATION LIST

Patent Literature

Patent Literature 1: JP H07-176775 A
Patent Literature 2: JP 2004-214342 A
Patent Literature 3: WO 2007/010706
Patent Literature 4: WO 2009/157449

SUMMARY OF INVENTION

Technical Problem

Nevertheless, the field of the art still demands a technique for further improving the adhesiveness between a water-impermeable sheet and a film or coat and the adhesiveness between a film or coat and an encapsulant layer formed from an ethylene/vinyl acetate copolymer (EVA).

In consideration of the above state of the art, the invention aims to provide a novel composition capable of providing a film or coat exhibiting excellent adhesiveness to a water-impermeable sheet and excellent adhesiveness to an EVA encapsulant layer even without corona discharge treatment.

Solution to Problem

The inventors studied a means for solving the above problem and found out that addition of a specific amount of a polyol compound having a specific hydroxyl value to a fluorine-containing polymer enables production of a film or coat with significantly improved adhesiveness to a water-impermeable sheet and to an EVA encapsulant layer, thereby completing the invention.

In other words, the invention relates to a composition containing a fluorine-containing polymer and a polyol compound having a hydroxyl value of 10 to 300, the polyol compound being contained in an amount of not less than 0.1 mass % but less than 100 mass % relative to the fluorine-containing polymer.

The polyol compound preferably has a number average molecular weight of 300 to 4000.

The polyol compound is preferably at least one selected from the group consisting of polyester polyols, polycarbonate polyols, polyether polyols, and polybutadiene polyols.

The fluorine-containing polymer is preferably at least one selected from the group consisting of curable functional group-containing fluorine-containing polymers, polyvinyl fluoride, and polyvinylidene fluoride.

The amount of the polyol compound is preferably 0.1 to 50 mass % relative to the fluorine-containing polymer.

The composition preferably further contains a curing agent.

The invention also relates to a laminate including a water-impermeable sheet and a layer formed from the above composition.

The laminate is preferably a back sheet for a solar cell module.

The invention also relates to a solar cell module including an encapsulant layer and the above laminate.

Advantageous Effects of Invention

Since the composition of the invention has the above configuration, it can provide a film or coat exhibiting excellent adhesiveness to a water-impermeable sheet and to an encapsulant layer formed from EVA.

Since the laminate of the invention has the above configuration, the water-impermeable sheet and the layer formed from the above composition are firmly bonded to each other, and the layer formed from the above composition can be firmly bonded to the encapsulant layer formed from EVA.

DESCRIPTION OF EMBODIMENTS

Figure 1:
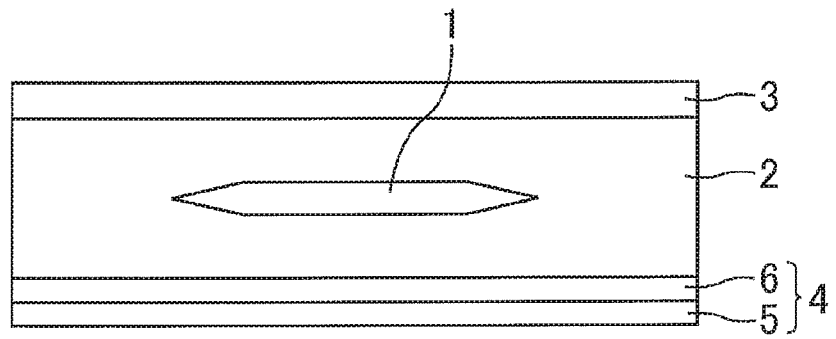
FIG. 1 is a schematic cross-sectional view of a first structure of a solar cell module.

The invention will specifically be described hereinbelow.

The composition of the invention characteristically contains a fluorine-containing polymer and a polyol compound.

The polyol compound has a hydroxyl value of 10 to 300. The hydroxyl value within the above range enables the resulting film or coat to firmly bond to a water-impermeable sheet and to an EVA encapsulant layer.

The polyol compound preferably has a number average molecular weight of 300 to 4000. The number average molecular weight is determined by gel permeation chromatography.

The polyol compound is preferably at least one selected from the group consisting of polyester polyols, polycarbonate polyols, polyether polyols, and polybutadiene polyols.

The composition contains the polyol compound in an amount of not less than 0.1 mass % but less than 100 mass % relative to the fluorine-containing polymer. The amount of the polyol compound is preferably 1 mass % or more, more preferably 5 mass % or more, while preferably 50 mass % or less, more preferably 20 mass % or less, relative to the fluorine-containing polymer. Too large an amount of the polyol compound may cause poor weather resistance of the film or coat. Too small an amount thereof may cause poor adhesiveness of the film or coat to a water-impermeable sheet and to an EVA encapsulant layer.

The polyol compound may be a commercially available product. Examples of the commercially available product include FLEXOREZ 148, FLEXOREZ 188, and FLEXOREZ A308 (Kusumoto Chemicals, Ltd.), ETERNACOLL UH-50 and ETERMACOLL UM-90 (Ube Industries, Ltd.), Adeka Polyether P-400 and Adeka Polyol BPX-21 (Adeka Corp.), NISSO-PB GI-1000, GI-2000, and GI-3000 (Nippon Soda Co., Ltd.).

The composition of the present invention further contains the fluorine-containing polymer. The fluorine-containing polymer is preferably at least one selected from the group consisting of curable functional group-containing fluorine-containing polymers, polyvinyl fluoride (PVF), and polyvinylidene fluoride (PVDF).

The PVF and the PVdF are preferably free from a curable functional group. The PVDF preferably has a weight average molecular weight of 200,000 to 600,000, more preferably 350,000 to 450,000. The PVDF is preferably used in a state of being blended with a (meth)acrylic resin to be mentioned later.

Examples of the curable functional group-containing fluorine-containing polymers include polymers obtainable by introducing a curable functional group into a fluorine-containing polymer. The curable functional group-containing fluorine-containing polymers include resin-like polymers having a clear melting point, elastomeric polymers exhibiting rubber elasticity, and thermoplastic elastomeric polymers between them.

The functional group that gives curability to the fluorine-containing polymer is appropriately selected in accordance with the easiness of production of the polymer and the curing system. Examples thereof include a hydroxy group (excluding the hydroxy group contained in a carboxy group; the same shall apply to the following), a carboxy group, a group represented by —COOCO—, a cyano group, an amino group, an epoxy group, and a silyl group. In order to achieve good curing reactivity, preferred is at least one selected from the group consisting of a hydroxy group, a carboxy group, a group represented by —COOCO—, an amino group, a cyano group, and a Silyl group, more preferred is at least one selected from the group consisting of a hydroxy group, a carboxy group, an amino group, and a silyl group, still more preferred is at least one selected from the group consisting of a hydroxy group, a carboxy group, and an amino group, and particularly preferred is at least one selected from the group consisting of a hydroxy group and a carboxy group. Introduction of any of these curable functional groups into the fluorine-containing polymer is usually achieved by copolymerization with a curable functional group-containing monomer.

Examples of the curable functional group-containing monomer include hydroxy-containing monomers, carboxy-containing monomers, amino-containing monomers, and silicone vinyl monomers. One of them or two or more of them may be used.

The curable functional group-containing fluorine-containing polymer preferably contains a polymerized unit based on a fluorine-containing monomer and a polymerized unit based on at least one curable functional group-containing monomer selected from the group consisting of hydroxy-containing monomers, carboxy-containing monomers, amino-containing monomers, and silicone vinyl monomers. The curable functional group-containing fluorine-containing polymer more preferably contains a polymerized unit based on a fluorine-containing monomer and a polymerized unit based on at least one curable functional group-containing monomer selected from the group consisting of hydroxy-containing monomers and carboxy-containing monomers.

Examples of the fluorine-containing monomer include tetrafluoroethylene, chlorotrifluoroethylene, vinylidene fluoride, vinyl fluoride, and fluorovinyl ether. One of them or two or more of them may be used.

Preferred is at least one selected from the group consisting of tetrafluoroethylene, chlorotrifluoroethylene, and vinylidene fluoride, and more preferred is at least one selected from the group consisting of tetrafluoroethylene and chlorotrifluoroethylene.

The polymerized unit based on a fluorine-containing monomer preferably represents 15 to 50 mol % of all the polymerized units of the curable functional group-containing fluorine-containing polymer. The lower limit of this amount is more preferably 20 mol %, still more preferably 30 mol %, particularly preferably 40 mol %. The upper limit thereof is more preferably 49 mol %, still more preferably 47 mol %.

The polymerized unit based on a curable functional group-containing monomer preferably represents 8 to 30 mol % of all the polymerized units of the curable functional group-containing fluorine-containing polymer. The lower limit of this amount is more preferably 10 mol %, while the upper limit thereof is more preferably 20 mol %.

Examples of the curable functional group-containing monomer include, but are not limited to, the following. One of them or two or more of them may be used.

(1-1) Hydroxy-Containing Monomers

Examples of the hydroxy-containing monomers include hydroxy-containing vinyl ethers such as 2-hydroxyethyl vinyl ether, 3-hydroxypropyl vinyl ether, 2-hydroxypropyl vinyl ether, 2-hydroxy-2-methylpropyl vinyl ether, 4-hydroxybutyl vinyl ether, 4-hydroxy-2-methylbutyl vinyl ether, 5-hydroxypentyl vinyl ether, and 6-hydroxyhexyl vinyl ether; and hydroxy-containing allyl ethers such as 2-hydroxyethyl allyl ether, 4-hydroxybutyl allyl ether, and glycerol mono allyl ether. Preferred are hydroxy-containing vinyl ethers because they exhibit excellent polymerization reactivity and functional-group curability. More preferred are hydroxy-containing monomers represented by the following formula (1):

$$CH_2=CH-(CH_2)_l-O-(CH_2)_m-OH$$

(wherein l is 0 or 1, and m is an integer of 2 or greater), and still more preferred is at least one monomer selected from the group consisting of 4-hydroxybutyl vinyl ether, 2-hydroxyethyl vinyl ether, 2-hydroxyethyl allyl ether, and 4-hydroxybutyl allyl ether.

Examples of other hydroxy-containing monomers include hydroxyalkyl esters of (meth)acrylic acid such as 2-hydroxyethyl acrylate and 2-hydroxyethyl methacrylate.

(1-2) Carboxy-Containing Monomers

A preferred example of the carboxy-containing monomers is at least one monomer selected from the group consisting of carboxy-containing monomers represented by the following formula (2):

$$R^1R^2C=CR^3-(CH_2)_n-COOH$$

(wherein $R^1$, $R^2$, and $R^3$ are the same as or different from each other, and are each a hydrogen atom, an alkyl group, a carboxy group, an acyloxy group, or an alkoxycarbonyl group; and n is an integer of 0 or greater), esters and acid anhydrides thereof, and carboxy-containing vinyl ether monomers represented by the following formula (3):

$$CH_2=CH(CH_2)_nO(R^4OCO)_mR^5COOH$$

(wherein $R^4$ and $R^5$ are the same as or different from each other, and are each a saturated or unsaturated linear, branched, or cyclic alkylene group; n is 0 or 1; and m is 0 or 1), Specific examples of the carboxy-containing monomers include acrylic acid, methacrylic acid, vinyl acetate, crotonic acid, pentenoic acid, hexenoic acid, heptenoic acid, octenoic acid, nonenoic acid, decenoic acid, undecylenic acid, dodecenoic acid, tridecenoic acid, tetradecenoic acid, pentadecenoic acid, hexadecenoic acid, heptadecenoic acid, octadecenoic acid, nonadecenoic acid, eicosenoic acid, 22-tricosenoic acid, cinnamic acid, itaconic acid, itaconic acid monoesters, maleic acid, maleic acid monoesters, maleic anhydrides, fumaric acid, fumaric acid monoesters, vinyl phthalate, vinyl pyromellitate, 3-allyloxypropionic acid, 3-(2-allyloxyethoxycarbonyl)propionic acid, 3-(2-allyloxybutoxycarbonyl)propionic acid, 3-(2-vinyloxyethoxycarbonyl)propionic acid, and 3-(2-vinyloxybutoxycarbonyl) propionic acid. Preferred among these is at least one acid selected from the group consisting of acrylic acid, crotonic acid, undecylenic acid, itaconic acid, maleic acid, maleic acid monoesters, fumaric acid, fumaric acid monoesters, 3-allyloxypropionic acid, and 3-(2-allyloxyethoxycarbonyl) propionic acid because they have low home-polymerizability and thus are less likely to produce a homopolymer.

(1-3) Amino-Containing Monomers

Examples of the amino-containing monomers include amino vinyl ethers represented by $CH_2=CH-O-(CH_2)_x-NH_2$ (where x=0 to 10); allyl amines represented by $CH_2=CH-O-CO(CH_2)_x-NH_2$ (where x=1 to 10); aminomethylstyrene, vinylamine, acrylamide, vinylacetamide, and vinylformamide.

(1-4) Silyl-Containing Monomers

Examples of the silyl-containing monomers include silicone vinyl monomers. Examples of the silicone vinyl monomers include (meth) acrylic acid esters such as $CH_2=CHCO_2(CH_2)_3Si(OCH_3)_3$, $CH_2=CHCO_2(CH_2)_3Si(OC_2H_5)_3$, $CH_2=C(CH_3)CO_2(CH_2)_3Si(OCH_3)_3$, $CH_2=C(CH_3)CO_2(CH_2)_3Si(OC_2H_5)_3$, $CH_2=CHCO_2(CH_2)_3SiCH_3(OC_2H_5)_2$, $CH_2=C(CH_3)CO_2(CH_2)_3SiC_2H_5(OCH_3)_2$, $CH_2=C(CH_3)CO_2(CH_2)_3Si(CH_3)_2(OC_2H_5)$, $CH_2=C(CH_3)CO_2(CH_2)_3Si(CH_3)_2OH$, $CH_2=CH(CH_2)_3Si(OCOCH_3)_3$, $CH_2=C(CH_3)CO_2(CH_2)_3SiC_2H_5(OCOCH_3)_2$, $CH_2=C(CH_3)CO_2(CH_2)_3SiCH_3(N(CH_3)COCH_3)_2$, $CH_2=CHCO_2(CH_2)_3SiCH_3[ON(CH_3)C_2H_5]_2$, and $CH_2=C(CH_3)CO_2(CH_2)_3SiC_6H_5[ON(CH_3)C_2H_5]_2$; vinylsilanes such as $CH_2=CHSi[ON=C(CH_3)(C_2H_5)]_3$, $CH_2=CHSi(OCH_3)_3$, $CH_2=CHSi(OC_2H_5)_3$, $CH_2=CHSiCH_3(OCH_3)_2$, $CH_2=CHSi(OCOCH_3)_3$, $CH_2=CHSi(CH_3)_2(OC_2H_5)$, $CH_2=CHSi(CH_3)_2SiCH_3(OCH_3)_2$, $CH_2=CHSiC_2H_5(OCOCH_3)_2$, $CH_2=CHSiCH_3[ON(CH_3)C_2H_5]_2$, vinyltrichlorosilane, and partially hydrolyzed products thereof; and vinyl ethers such as trimethoxysilylethyl vinyl ether, triethoxysilylethyl vinyl ether, trimethoxysilylethyl vinyl ether, methyldimethoxysilylethyl vinyl ether, trimethylsilyl propyl vinyl ether, and trimethylsilylpropyl vinyl ether.

The curable functional group-containing fluorine-containing polymer preferably contains a polymerized unit based on at least one nonfluorinated vinyl monomer selected from the group consisting of vinyl carboxylates, alkyl vinyl ethers, and nonfluorinated olefins.

The vinyl carboxylates have an effect of improving the compatibility. Examples of the vinyl carboxylates include vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butyl benzoate.

Examples of the alkyl vinyl ethers include methyl vinyl ether, ethyl vinyl ether, butyl vinyl ether, and cyclohexyl vinyl ether.

Examples of the nonfluorinated olefins include ethylene, propylene, n-butene, and isobutene.

The polymerized unit based on a nonfluorinated vinyl monomer preferably constitutes every polymerized unit other than the polymerized units based on a curable functional group-containing monomer and the polymerized units based on a fluorine-containing monomer.

Examples of the curable functional group-containing fluorine-containing polymer include (1) perfluoroolefinic polymers mainly containing a perfluoroolefin unit, (2) chlorotrifluoroethylene (CTFE) polymers mainly containing a CTFE unit, (3) vinylidene fluoride (VdF) polymers mainly containing a VdF unit, (4) fluoroalkyl-containing polymers mainly containing a fluoroalkyl unit, and (5) vinyl acetate polymers mainly containing a vinyl acetate unit.

In terms of weather resistance and moisture proofing, the curable functional group-containing fluorine-containing polymer is preferably any of the polymers (1), (2), and (5) among the polymers (1) to (5).

(1) Perfluoroolefinic Polymers Mainly Containing Perfluoroolefin Unit

The perfluoroolefinic polymers mainly containing a perfluoroolefin unit preferably contain a perfluoroolefin unit. The perfluoroolefin unit preferably represents 20 to 49 mol % of all the polymerized units of the perfluoroolefinic polymer. The lower limit of this amount is more preferably 30 mol %, still more preferably 40 mol %. The upper limit thereof is more preferably 47 mol %.

Examples of the perfluoroolefin include tetrafluoroethylene (TFE), hexafluoropropylene (HFP), and perfluoro(alkyl vinyl ethers)(PAVEs). Preferred is TFE because it exhibits excellent pigment dispersibility, weather resistance, copolymerizability, and chemical resistance.

The perfluoroolefinic polymers preferably contain a unit based on a different monomer copolymerizable with the perfluoroolefin.

Examples of the different copolymerizable monomer include, but are not limited to, vinyl carboxylates such as vinyl acetate, vinyl propionate, vinyl butyrate, vinyl isobutyrate, vinyl pivalate, vinyl caproate, vinyl versatate, vinyl laurate, vinyl stearate, vinyl cyclohexylcarboxylate, vinyl benzoate, and vinyl para-t-butyl benzoate; alkyl vinyl ethers such as methyl vinyl ether, ethyl vinyl ether, butyl vinyl ether, and cyclohexyl vinyl ether; nonfluorinated olefins such as ethylene, propylene, n-butene, and isobutene; and fluoromonomers such as vinylidene fluoride (VdF), chlorotrifluoroethylene (CTFE), vinyl fluoride (VF), and fluorovinyl ethers.

Examples of the perfluoroolefinic polymers mainly containing a perfluoroolefin unit include copolymers of TFE/isobutylene/hydroxybutyl vinyl ether/different monomer, copolymers of TFE/vinyl versatate/hydroxybutyl vinyl ether/different monomer, copolymers of TFE/vinyl versatate/hydroxyethyl vinyl ether/different monomer, and copolymers of TFE/VdF/hydroxybutyl vinyl ether/different monomer. Particularly preferred is at least one copolymer selected from the group consisting of copolymers of TFE/isobutylene/hydroxybutyl vinyl ether/different monomer and copolymers of TFE/vinyl versatate/hydroxybutyl vinyl ether/different monomer. Examples of coatings based on such curable polymers include ZEFFLE® GK grades (Daikin Industries, Ltd.).

(2) Chlorotrifluoroethylene (CTFE) Polymers Mainly Containing CTFE Unit

Examples of the CTFE polymers mainly containing a CTFE unit include copolymers of CTFE/hydroxybutyl vinyl ether/different monomer. Examples of curable polymer coatings based on the CTFE polymers include LUMIFLON® (Asahi Glass Co., Ltd.), FLUONATE® (Dainippon Printing Ink Manufacturing Co., Ltd.), CEFRAL COAT® (Central Glass Co., Ltd.), and ZAFLON® (Toagosei Co., Ltd.).

(3) Vinylidene Fluoride (VdF) Polymers Mainly Containing VdF Unit

Examples of the VdF polymers mainly containing a VdF unit include copolymers of VdF/TFE/hydroxybutyl vinyl ether/different monomer.

(4) Fluoroalkyl-containing Polymers Mainly Containing Fluoroalkyl Unit

Examples of the fluoroalkyl-containing polymers mainly containing a fluoroalkyl unit include copolymers of $CF_3CF_2(CF_2CF_2)_nCH_2CH_2OCOCH=CH_2$ (mixture of n=3 and n=4)/2-hydroxyethyl methacrylate/stearyl acrylate. Examples of the fluoroalkyl-containing polymers include UNIDYNE® and FTONE® (Daikin Industries, Ltd.), and Zonyl® (DuPont).

(5) Vinyl Acetate Polymers Mainly Containing Vinyl Acetate Unit

Examples of the vinyl acetate polymers mainly containing a vinyl acetate unit include copolymers of fluorine-containing monomer/vinyl acetate/hydroxy-containing monomer of formula (1)/carboxy-containing monomer of formula (2). These copolymers preferably satisfies that the mole ratio of fluorine-containing monomer/vinyl acetate/hydroxy-containing monomer of formula (1)/carboxy-containing monomer of formula (2) is (15 to 50)/(20 to 75)/(5 to 22)/(0.1 to 5), more preferably (15 to 50)/(23 to 75)/(5 to 22)/(0.1 to 5).

From the viewpoints of weather resistance, solvent resistance, stain resistance, and coat hardness, the copolymer preferably satisfies that the proportion of the fluorine-containing monomer unit and the vinyl acetate unit to the sum of the moles of the fluorine-containing monomer unit and the vinyl acetate unit is 0.16 to 0.51. The proportion is more preferably 0.22 or more, while more preferably 0.50 or less. The proportion can be calculated from the fluorine content (mass %) determined by elemental analysis and the compositional analysis by $^1$H-NMR spectrum. The copolymer satisfying the above proportion is a novel composition the inventors have found out.

The hydroxy-containing monomer represented by the formula (1) is preferably at least one monomer selected from the group consisting of hydroxyethyl vinyl ether (HEVE), hydroxybutyl vinyl ether (HBVE), 2-hydroxyethyl allyl ether, and 4-hydroxybutyl allyl ether.

In the carboxy-containing monomer represented by the formula (2), n is preferably as great as possible so as to give improved polymerization reactivity and improved compatibility with additives such as a curing agent. Here, n is preferably 2 or greater, more preferably 4 or greater, still more preferably 8 or greater. The upper limit thereof is 20, for example. The carboxy-containing monomer represented by the formula (2) is preferably at least one selected from the group consisting of pentenoic acid, hexenoic acid, heptenoic acid, octenoic acid, nonenoic acid, decenoic acid, undecylenic acid, dodecenoic acid, tridecenoic acid, tetradecenoic acid, pentadecenoic acid, hexadecenoic acid, heptadecenoic acid, octadecenoic acid, nonadecenoic acid, eicosenoic acid, and 22-tricosenoic acid, and more preferably undecylenic acid.

The copolymer may further contain a different monomer unit. The different monomer unit preferably represents 0 mol % or more and 40 mol % or less, more preferably 25 mol % or less, of all the structural units constituting the copolymer. Examples of the different monomer include non-aromatic vinyl esters other than vinyl acetate. Examples of the non-aromatic vinyl esters include vinyl versatate, vinyl laurate, vinyl stearate, and vinyl cyclohexylcarboxylate.

The vinyl acetate polymer preferably has a number average molecular weight of 3,000 to 100,000. The number average molecular weight is more preferably 5,000 or higher, still more preferably 8,000 or higher, while more preferably 50,000 or lower, still more preferably 35,000 or lower. The number average molecular weight can be measured by gel permeation chromatography (GPC) with tetrahydrofuran used as an eluent.

The vinyl acetate polymer preferably has a glass transition temperature (second run) of 10° C. to 70° C., more preferably 15° C. to 60° C., measured using a differential scanning calorimeter (DSC).

The vinyl acetate polymer preferably has an acid value of 0.6 to 28.8 mgKOH/g, more preferably 2 to 12 mgKOH/g. The acid value is measured in conformity with JIS K5601.

The vinyl acetate polymer preferably has a hydroxyl value of 29 to 120 mgKOH/g, more preferably 100 mgKOH/g or lower. The hydroxyl value can be calculated from the actual amount and solid concentration of the hydroxy monomer in polymerization.

The curable functional group-containing fluorine-containing polymer can be produced by a method disclosed in JP 2004-204205 A or JP 2013-177536 A, for example.

The novel copolymer satisfying that the proportion of the fluorine-containing monomer unit and the vinyl acetate unit is 0.16 to 0.51 can be produced by solution polymerization, emulsion polymerization, suspension polymerization, or bulk polymerization, and is preferably produced by solution polymerization.

In solution polymerization, the monomers, an organic solvent, and a polymerization initiator can be used. The polymerization temperature is usually 0° C. to 150° C., preferably. 5° C. to 95° C. The polymerization pressure is usually 0.1 to 10 MPaG (1 to 100 kgf/cm$^2$G).

Examples of the organic solvent include esters such as methyl acetate, ethyl acetate, propyl acetate, n-butyl acetate, and tert-butyl acetate; ketones such as acetone, methyl ethyl ketone, and cyclohexanone; aliphatic hydrocarbons such as hexane, cyclohexane, octane, nonane, decane, undecane, dodecane, and mineral spirits; aromatic hydrocarbons such as benzene, toluene, xylene, naphthalene, and solvent naphtha; alcohols such as methanol, ethanol, tert-butanol, isopropanol, and ethylene glycol monoalkyl ethers; cyclic ethers such as tetrahydrofuran, tetrahydropyran, and dioxane; and dimethyl sulfoxide, and mixtures thereof.

Examples of the polymerization initiator include persulfates such as ammonium persulfate and potassium persulfate (optionally in combination with any of reducing agents such as sodium hydrogen sulfite, sodium pyrosulfite, cobalt naphthenate, and dimethyl aniline); redox initiators each of which is a combination of an oxidizing agent (e.g., ammonium peroxide or potassium peroxide), a reducing agent (e.g., sodium sulfite), and a transition metal salt (e.g., iron sulfate); diacyl peroxides such as acetyl peroxide and benzoyl peroxide; dialkoxycarbonyl peroxides such as isopropoxycarbonyl peroxide and tert-butoxycarbonyl peroxide; ketone peroxides such as methyl ethyl ketone peroxide and cyclohexanone peroxide; hydroperoxides such as hydrogen peroxide, tert-butyl hydroperoxide, and cumene hydroperoxide; dialkyl peroxides such as di-tort-butyl peroxide and dicumyl peroxide; alkyl peroxy esters such as tert-butyl peroxyacetate and tert-butyl peroxypivalate; and azo compounds such as 2,2'-azobisisobutyronitrile, 2,2'-azobis(2,4-dimethylvaleronitrile), 2,2'-azobis(2-methylvaleronitrile), 2,2'-azobis(2-cyclopropylpropionitrile), 2,2'-azobis-dimethyl isobutyrate, 2,2'-azobis[2-(hydroxymethyl)propionitrile], and 4,4'-azobis(4-cyanopentenoic acid).

The composition preferably further contains an organic solvent. The composition containing an organic solvent is advantageous in that it can be formed into a film by casting or it can be formed into a coat by application thereof to a substrate.

Since the composition contains the polyol compound, it also exhibits an excellent pot life even when it is prepared as a dispersion or solution in which the fluorine-containing polymer is dispersed or dissolved in an organic solvent.

Examples of the organic solvent include esters such as ethyl acetate, n-butyl acetate, tert-butyl acetate, isopropyl acetate, isobutyl acetate, cellosolve acetate, and propylene glycol methyl ether acetate; ketones such as acetone, methyl ethyl ketone, methyl isobutyl ketone, and cyclohexanone; cyclic ethers such as tetrahydrofuran and dioxane; amides such as N,N-dimethyl formamide and N,N-dimethyl acetamide; aromatic hydrocarbons such as toluene and xylene; alcohols such as propylene glycol methyl ether; hydrocarbons such as hexane and heptane; carbonates such as propylene carbonate; lactams such as N-methylpyrrolidone; lactones such as γ-butyrolactone; cyclic sulfones such as sulfolane; and solvent mixtures thereof. Examples thereof also include the third-class organic solvents mentioned in the Industrial Safety and Health Act and solvents equivalent thereto, which are called weak solvents. In the case of preparing a solution of the fluorine-containing polymer in an organic solvent, the concentration of the fluorine-containing polymer has only to be 5 to 95 mass %, preferably 10 to 80 mass %.

The composition preferably further contains a curing agent. The composition particularly preferably contains a curing agent when it contains the curable functional group-containing fluorine-containing polymer as the fluorine-containing polymer.

The curing agent is a compound crosslinkable by a reaction with a curable functional group of the curable functional group-containing fluorine-containing polymer, and common examples thereof include isocyanates, amino resins, acid anhydrides, polyepoxy compounds, and isocyanate-containing silane compounds. Preferred are isocyanates.

Specific examples of the isocyanates include, but are not limited to, 2,4-tolylene diisocyanate, diphenylmethane-4,4'-diisocyanate, xylylene diisocyanate, isophorone diisocyanate, lysine methyl ester diisocyanate, methyl cyclohexyl diisocyanate, trimethyl hexamethylene diisocyanate, hexamethylene diisocyanate, n-pentane-1,4-diisocyanate, trimers thereof, adduct products, biuret products, or isocyanurate products thereof, polymers thereof containing two or more isocyanate groups, and block isocyanates. Preferred are isocyanurate products.

Specific examples of the amino resins include, but are not limited to, urea resin, melamine resin, benzoguanamine resin, glycoluril resin, as well as methylolated melamine resin produced by methylolating melamine, and alkyl etherified melamine resin produced by etherifying methylolated melamine with an alcohol such as methanol, ethanol, or butanol.

Specific examples of the acid anhydrides include, but are not limited to, phthalic anhydride, pyromellitic anhydride, and mellitic anhydride.

Examples of the polyepoxy compounds and the isocyanate-containing silane compounds to be used include those disclosed in JP H02-232250 A and JP H02-232251 A. For preferred examples, those represented by the following formulas:

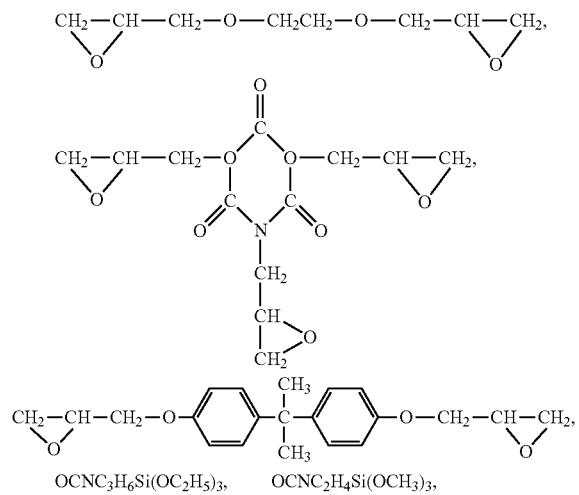

may be mentioned.

The amount of the curing agent is 0.1 to 5 equivalents, preferably 0.5 to 1.5 equivalents, relative to 1 equivalent of the curable functional group in the curable functional group-containing fluorine-containing polymer. For the composition containing a curable functional group-containing fluorine-containing polymer as the fluorine-containing polymer and further containing a curing agent, the composition can usually be cured at 0° C. to 200° C. within several minutes to about 10 days.

The composition also preferably further contains a second resin other than the fluorine-containing polymer. Examples of the second resin include organic resin such as polystyrene, (meth)acrylic resin, polyester resin, alkyd resin, melamine-formaldehyde resin, polyisocyanate resin, epoxy resin, vinyl chloride resin (e.g., vinyl chloride-vinyl acetate copolymers), ketone resin, and petroleum resin, as well as chlorinated products of polyolefins such as polyethylene and polypropylene; inorganic resin such as silica gel and silicic acid; and various fluororesins other than the fluorine-containing polymer (e.g., homopolymers of tetrafluoroethylene and of chlorotrifluoroethylene, and copolymers thereof with another monomer). The proportion of the second resin is 900 parts by mass or less, preferably 500 parts by mass or less, relative to 100 parts by mass of the fluorine-containing polymer. The lower limit thereof is an amount required to achieve the target properties, and depends on the type of the resin. For (meth)acrylic resin, the lower limit is usually 5 parts by mass or more, preferably 10 parts by mass or more.

The composition preferably contains a (meth)acrylic resin especially having excellent compatibility among these resins, which leads to a film having good gloss, high hardness, and good finish appearance.

Examples of the (meth)acrylic resin include (meth)acrylic polymers conventionally used for coatings. Particularly preferred are (i) homopolymers or copolymers of a C1-C10 alkyl ester of (meth)acrylic acid and (ii) (meth)acrylic acid ester copolymers having a curable functional group in a side chain and/or at an end of the main chain.

Examples of the (meth)acrylic polymers (i) include homopolymers and copolymers of a C1-C10 alkyl ester of (meth)acrylic acid such as n-butyl (meth)acrylate, isobutyl (meth)acrylate, and 2-ethylhexyl (meth)acrylate, and copolymers thereof with an ethylenic unsaturated monomer copolymerizable therewith.

Examples of the copolymerizable ethylenic unsaturated monomer include aromatic vinyl monomers such as aromatic group-containing (meth)acrylates, (meth)acrylates having a fluorine atom or a chlorine atom at the α position, fluoroalkyl (meth)acrylates in which an alkyl group is replaced by a fluorine atom, vinyl ethers, vinyl esters, and styrene, olefins such as ethylene, propylene, isobutylene, vinyl chloride, and vinylidene chloride, fumaric acid diesters, maleic acid diesters, and (meth)acrylonitrile.

Examples of the (meth)acrylic polymers (ii) include copolymers of a monomer that gives the (meth)acrylic polymer (i) described above and a monomer having a curable functional group. Examples of the curable functional group-containing monomer include monomers having any of a hydroxy group, a carboxy group, an epoxy group, and an amino group. Specific examples of the (meth)acrylic polymers (ii) include, but are not limited to, copolymers of a monomer having a curable functional group such as hydroxyethyl (meth)acrylate, 2-hydroxypropyl (meth)acrylate, 2-hydroxyethyl vinyl ether, (meth)acrylic acid, glycidyl (meth)acrylate, 2-aminoethyl (meth)acrylate, or 2-aminopropyl (meth)acrylate and the C1-C10 alkyl ester of (meth)acrylic acid and copolymers of any of these monomers and the copolymerizable ethylenic unsaturated monomer.

The (meth)acrylic polymer preferably has a number average molecular weight determined by GPC of 1,000 to 200,000, more preferably 2,000 to 100,000. The higher the number average molecular weight is, the lower the solvent solubility tends to be. The lower the number average molecular weight is, the more inappropriate the weather resistance tends to be.

The composition may further contain an additive. Examples of the additive include a curing accelerator, a pigment, a pigment dispersant, a leveling agent, an antifoam, an anti-gelling agent, an ultraviolet absorber, an antioxidant, a hydrophilic agent, a dispersant, a fluidity improver, a flatting agent, and a flame retardant.

Examples of the curing accelerator include organotin compounds, acidic phosphoric acid esters, reaction products of an acidic phosphoric acid ester and an amine, saturated or unsaturated polycarboxylic acids and acid anhydrides thereof, organotitanate compounds, amine compounds, lead octylate, and metal chelate compounds containing aluminum.

Examples of the metal chelate compounds include aluminum tris(acetylacetonate), aluminum ethylacetoacetate diisopropylate, aluminum tris(ethylacetoacetate), aluminum alkylacetoacetate diisopropylate, and aluminum bisethylacetoacetate monoacetylacetonate.

Specific examples of the organotin compounds include dibutyltin dilaurate, dibutyltin maleate, dioctyltin maleate, dibutyltin diacetate, dibutyltin phthalate, tin octylate, tin naphthenate, and dibutyltin methoxide.

The acidic phosphoric acid esters are phosphoric acid esters containing a moiety represented by the following formula.

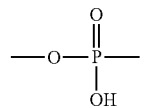

Examples thereof include organic acidic phosphoric acid esters represented by the following formula:

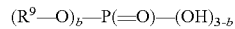

wherein b is 1 or 2; and $R^9$ is an organic residue.

Specific examples thereof include those represented by the following formulas,

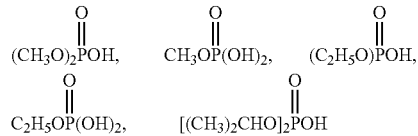

Examples of the organotitanate compounds include titanic acid esters such as tetrabutyl titanate, tetraisopropyl titanate, and triethanolamine titanate. Examples of commercially available products thereof include ORGATIX TC-100, TC-750, TC-760, and TA-30 (Matsumoto Fine Chemical Co., Ltd.).

Specific examples of the amine compounds include amine compounds such as butylamine, octylamine, dibutylamine, monoethanolamine, diethanolamine, triethanolamine, diethylenetriamine, triethylenetetramine, oleylamine, cyclohexylamine, benzylamine, diethylaminopropylamine, xylylenediamine, triethylenediamine, guanidine, diphenylguanidine, 2,4,6-tris(dimethylaminomethyl)phenol, morpholine, N-methylmorpholine, 1,8-diazabicyclo(5.4.0)undecene-7 (DBU), carboxylic acid salts thereof, low molecular weight polyamide resins obtainable from excessive amounts of a polyamine and a polybasic acid, and reaction products of excessive amounts of a polyamine and an epoxy compound.

The curing accelerators may be used alone or in combination of two or more thereof. The amount of the curing accelerator is preferably about $1.0 \times 10^{-6}$ to $1.0 \times 10^{-2}$ parts by mass, more preferably about $5.0 \times 10^{-5}$ to $1.0 \times 10^{-3}$ parts by mass, relative to 100 parts by mass of the fluorine-containing polymer.

Specific examples of the pigment include, but are not limited to, inorganic pigments such as titanium dioxide, calcium carbonate, and carbon black; and organic pigments such as phthalocyanine pigments, quinacridone pigments, and azo pigments. The upper limit of the amount of the pigment is usually about 200 parts by mass relative to 100 parts by mass of the fluorine-containing polymer.

Examples of the pigment include titanium dioxide. The titanium dioxide may be in any form, either rutile or anatase. In order to achieve good weather resistance, the rutile form is preferred. The titanium dioxide may be in the form of fine particles having a surface subjected to inorganic treatment or organic treatment, or to both inorganic and organic treatments. Examples of the inorganically treated titanium dioxide include titanium dioxide fine particles having a surface coated with alumina ($Al_2O_3$), silica ($SiO_2$), or zirconia ($ZrO_2$). Examples of the organically treated titanium dioxide include those subjected to surface treatment with a silane-coupling agent, those subjected to surface treatment with an organosiloxane, those subjected to surface treatment with an organic polyol, and those subjected to surface treatment with an alkyl amine. The titanium dioxide preferably has a basic value higher than the acid value thereof determined by titration.

Examples of commercially available products of the titanium dioxide include D-918 (Sakai Chemical Industry Co., Ltd.), R-960, R-706, and R-931 (DuPont), and PFC-105 (Ishihara Sangyo Kaisha, Ltd.).

The amount of the titanium dioxide is preferably 1 to 500 parts by mass relative to 100 parts by mass of the fluorine-containing polymer. Less than 1 part by mass of the titanium dioxide may fail to block ultraviolet rays. More than 500 parts by mass thereof may suffer yellowing and deterioration due to ultraviolet rays. The amount of the titanium dioxide is more preferably 5 parts by mass or more, still more preferably 10 parts by mass or more, while more preferably 300 parts by mass or less, still more preferably 200 parts by mass or less.

The pigment may also be carbon black. The carbon black may be any one, such as any of those commonly known. In order to achieve an effect of blocking ultraviolet rays, the carbon black preferably has an average particle size of 10 to 150 nm, more preferably 20 to 100 nm. The average particle size is a value determined by electron microscopic observation.

The carbon black may agglomerate in the composition. In order to achieve an effect of blocking ultraviolet rays, the average particle size thereof in this case is preferably 50 to 1,000 nm, more preferably 100 to 700 nm, still more preferably 100 to 500 nm. The average particle size is a value determined using a laser diffraction scattering particle size distribution analyzer.

The amount of the carbon black is preferably 0.5 to 80 parts by mass relative to 100 parts by mass of the fluorine-containing polymer. The carbon black in an amount within the above range can well disperse in the coating. The amount of the carbon black is more preferably 3 parts by mass or more, still more preferably 10 parts by mass or more, while more preferably 60 parts by mass or less, still more preferably 50 parts by mass or less, relative to 100 parts by mass of the fluorine-containing polymer.

Examples of commercially available products of the carbon black include MA-100 (Mitsubishi Chemical Corp.) and Raven-420 (Columbian Carbon Co.).

The composition containing the pigment preferably further contains a dispersant or fluidity improver mentioned below.

Examples of the dispersant include a compound having an acid radical (other than those having an unsaturated group). Examples of the acid radical include a phosphate group, a carboxylate group, and a sulfonate group. In order to prevent agglomeration of the pigment for a long time and to achieve excellent storage stability of the composition, the acid radical is preferably at least one selected from the group consisting of a phosphate group and a carboxylate group, more preferably a phosphate group. The dispersant also contains a compound free from an unsaturated group. Since the compound is free from an unsaturated group, it is less likely to be degenerated by exposure to ultraviolet rays.

The dispersant preferably has a weight average molecular weight of 300 to 1,000,000. The dispersant having a weight average molecular weight of less than 300 may have an adsorbed resin layer with insufficient steric stabilization, failing to prevent agglomeration of the titanium dioxide. The dispersant having a weight average molecular weight exceeding 1,000,000 may cause mottle and reduced weather resistance. The weight average molecular weight is more preferably 1,000 or more and 100,000 or less. The weight average molecular weight can be determined by gel permeation chromatography (GPC) (polystyrene equivalent).

In order to achieve effective adsorption to the titanium dioxide surface, the dispersant preferably has an acid value of 3 to 2,000 mgKOH/g. The acid value is more preferably 5 mgKOH/g or higher, still more preferably 10 mgKOH/g or higher, while more preferably 1,000 mgKOH/g or lower, still more preferably 500 mgKOH/g or lower. The acid value can be determined by acid-base titration using a basic substance.

The dispersant may further contain a base. The base may be an amino group, for example.

In order to achieve good long-term storage stability of the dispersant, the dispersant preferably has a basic value of 15 mgKOH/g or lower, more preferably 5 mgKOH/g or lower. The dispersant having an acid value of 15 mgKOH/g or lower still more preferably has a basic value of lower than 5 mgKOH/g.

The dispersant is still more preferably substantially free from a base. The phrase "substantially free from a base" herein means that the measured basic value is 0.5 mgKOH/g or lower in consideration of contamination, reaction residues, measurement errors, and other relating factors. The basic value can be determined by acid-base titration using an acidic substance.

The dispersant may be any of commercially available products. Examples thereof include DISPARLON 2150, DISPARLON DA-325, DA-375, and DA-1200 (trade name, Kusumoto Chemicals, Ltd.), FLOWLEN G-700 and G-900 (trade name, Kyoeisha Chemical Co., Ltd.), SOLSPERSE 26000, 32000, 36000, 36600, 41000, and 55000 (trade name, Lubrizol Japan Ltd.), and DISPERBYK-102, 106, 110, 111, 140, 142, 145, 170, 171, 174, and 180 (trade name, BYK Japan KK). In order to achieve good long-term storage stability, preferred are DISPARLON DA-375, FLOWLEN G-700, and SOLSPERSE 36000, and more preferred is DISPARLON DA-375.

The dispersant is preferably used in combination with the titanium dioxide. The amount of the dispersant is preferably 0.1 to 100 parts by mass relative to 100 parts by mass of the titanium dioxide. Less than 0.1 parts by mass of the dispersant may fail to achieve an effect of preventing precipitation of the pigment. More than 100 parts by mass thereof tends to cause mottle and reduced weather resistance. The amount of the dispersant is more preferably 0.5 parts by mass or more, still more preferably 1.5 parts by mass or more, while more preferably 50 parts by mass or less, still more preferably 20 parts by mass or The fluidity improver may be an associative acrylic polymer having an acid radical and a base. The associative acrylic polymer herein means a polymer in which polar groups contained in the acrylic polymer chains form a structure by, for example, partial adsorption due to hydrogen bonds or electric interactions in the polymer chains or between the polymer chains to achieve an effect of increasing the viscosity of the liquid.

Examples of the acrylic polymer include copolymers containing, as a main monomer, a (meth)acrylate such as methyl (meth)acrylate, ethyl (meth)acrylate, n-butyl (meth)acrylate, isobutyl (meth)acrylate, t-butyl (meth)acrylate, n-octyl (meth)acrylate, isooctyl (meth)acrylate, 2-ethylhexyl (meth)acrylate, isononyl (meth)acrylate, and cyclohexyl (meth)acrylate. The term "(meth)acrylate" herein includes both acrylate and methacrylate.

The acid radical is preferably a carboxylate group, a phosphate group, or a sulfonate group. In order to prevent agglomeration of the pigment for a long time and to maintain the storage stability of the composition, a carboxylate group is particularly preferred. The base may be an amino group.

The fluidity improver may be a reaction product between a carboxylic acid and a nitrogen-containing compound such as hydroxylamine or hydroxyimine. The ratio between the carboxylic acid and the nitrogen-containing compound to be reacted is most preferably 1:1. Examples of the carboxylic acid include dicarboxylic acids and acid anhydrides. Examples of the hydroxylamine include primary, secondary, or tertiary alkanol amines such as monoethanol amine, propanol amine, diethanol amine, triethanol amine, and n-butyl diethanol amine, and mixtures thereof. Examples of the hydroxyimine include those having an oxazoline structure such as, specifically, Alkaterge T (trade name, Angus Chemical Co.).

The fluidity improver preferably has a weight average molecular weight of 1,000 to 1,000,000. The fluidity improver having a weight average molecular weight of less than 1,000 may insufficiently form an associative structure and fail to prevent precipitation of the titanium dioxide. The fluidity improver having a weight average molecular weight exceeding 1,000,000 may cause an excessive increase in the viscosity of the liquid, impairing the coating easiness. The weight average molecular weight is more preferably 5,000 or more and 100,000 or less. The weight average molecular weight can be determined by gel permeation chromatography (GPC) (polystyrene equivalent).

The fluidity improver may be a commercially available product. An example thereof is SOLTHIX 250 (trade name, Lubrizol Japan Ltd.).

The amount of the fluidity improver is preferably 0.05 to 20 mass % in the composition. Less than 0.05 mass % of the fluidity improver may fail to prevent precipitation of the titanium dioxide. More than 20 mass % thereof may cause separation or mottle. The amount of the fluidity improver is more preferably 0.1 mass % or more, still more preferably 0.3 mass % or more, while more preferably 10 mass % or less, still more preferably 5 mass % or less.

Examples of the hydrophilic agent include methyl silicate, ethyl silicate, fluoroalkyl silicate, and condensation products thereof. Examples of commercially available products thereof include ET40 and ET48 (Colcoat. Co., Ltd.), MS56, MS56S, and MS57 (Mitsubishi Chemical Corp.), and GH700 and GH701 (Daikin Industries, Ltd.).

Examples of the flatting agent include silica, silica alumina, alumina, talc, calcium carbonate, and titanium dioxide. The amount of the flatting agent is preferably 1 to 100 mass % relative to the fluorine-containing polymer. Examples of commercially available products thereof include Sylysia 350, Sylysia 436, Sylysia 446, Sylophobic 100, and Sylophobic 200 (Fuji Silysia Chemical Ltd.), and SYLOID 802, SYLOID ED30, and SYLOID 18050 (W. R. Grace).

The flame retardant is preferably an agent generating incombustible gas in an early stage of combustion to dilute combustible gas and/or to block oxygen, thereby achieving the incombustibility.

The flame retardant is preferably at least one selected from the group consisting of compounds containing an element from Group 5B of the Periodic Table and compounds containing a halogen compound from. Group 7B of the Periodic Table.

Examples of the compounds containing a halogen compound from Group 7B of the Periodic Table include aliphatic, alicyclic, or aromatic organohalogen compounds, such as bromine-based compounds, including tetrabromobisphenol A (TBA), decabromodiphenyl ether (DBDPE), octabromodiphenyl ether (OBDPE), TBA epoxy/phenoxy oligomers, and brominated crosslinked polystyrene, and chlorine-based compounds, including chlorinated paraffin and perchlorocyclopentadecane.

Examples of the compounds containing an element from Group 5B of the Periodic Table include phosphorus compounds such as phosphoric acid esters and polyphosphoric acid salts. Also preferred are antimony compounds used in combination with a halogen compound, such as antimony trioxide and antimony pentoxide. Aluminum hydroxide, magnesium hydroxide, and molybdenum trioxide may also be used.

At least one of these flame retardants may be selected and used in any amount in accordance with the type of the fluorine-containing polymer, and the flame retardant is not limited thereto.

The flame retardant is specifically more preferably a phosphorus- and nitrogen-containing composition (A) or a mixture (B) of a bromine-containing compound and an antimony-containing compound. Combination of the fluorine-containing polymer with such a flame retardant leads to high incombustibility.

The phosphorus- and nitrogen-containing composition (A) is preferably a mixture of a piperazine pyrophosphate and melamine cyanurate. Examples of the piperazine pyrophosphate include those disclosed in JP S48-088791 A and in U.S. Pat. No. 4,599,375 B. One example of the melamine cyanurate is powder of a reaction product of melamine and cyanuric acid. The reaction product of melamine and cyanuric acid has many nitrogen atoms in the structure, and generates nitrogen gas when exposed to a high temperature of about 350° C. or higher, exhibiting an action of inhibiting combustion.

The phosphorus- and nitrogen-containing composition (A) preferably satisfies that the mass ratio of the melamine cyanurate to the piperazine pyrophosphate is 0.014 to 3.000. The melamine cyanurate in a ratio within the above range can improve the incombustibility and leads to good blocking performance of the film. The mass ratio of the melamine cyanurate to the piperazine pyrophosphate is more preferably 0.04 or higher, still more preferably 0.1 or higher, while more preferably 1.4 or lower, still more preferably 0.5 or lower, in the mixture.

Examples of commercially available products to be used as the phosphorus- and nitrogen-containing composition (A) include SCFR-200 (Sakai Chemical Industry Co., Ltd.) and SCFR-110 (Sakai Chemical Industry Co., Ltd.), The bromine-containing compound is preferably an aromatic compound having a bromine content of 65% or higher, a melting point of 200° C. or higher, and a 5% decomposition temperature of 340° C. or higher.

Specifically, the bromine-containing compound is preferably at least one selected from the group consisting of decabromodiphenyl oxide, 1,2-bis(2,3,4,5,6-pentabromophenyl)ethane, tris(tribromophenoxy)triazine, ethylene bistetrabromophthalimide, polybromophenylindan, brominated phenylene oxide, and polypentabromobenzyl acrylate.

In particular, 1,2-bis(2,3,4,5,6-pentabromophenyl)ethane represented by the following formula (a) is more preferred because it has a high melting point and does not melt or bleed out even when the film is heat-cured.

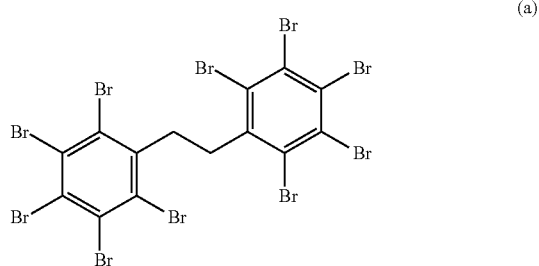 [SMILES: Brc1c(Br)c(Br)c(CCc2c(Br)c(Br)c(Br)c(Br)c2Br)c(Br)c1Br]

(a)

The bromine-containing compound may be a commercially available product, such as SAYTEX 8010 (Albemarle Corp.).

Examples of the antimony-containing compound include antimony oxides such as antimony trioxide and antimony pentoxide. In terms of acquisition at a low price, antimony trioxide is preferred.

The mixture (B) of a bromine-containing compound and an antimony-containing compound preferably contains 50 to 90 mass % of the bromine-containing compound. The bromine-containing compound in an amount within the above range is expected to improve the incombustibility owing to a combined effect with antimony oxide. The amount of the bromine-containing compound in the mixture is more preferably 55 mass % or more, still more preferably 60 mass % or more, while more preferably 85 mass % or less, still more preferably 80 mass % or less.

The amount of the flame retardant is preferably 1 to 45 parts by mass relative to 100 parts by mass of the fluorine-containing polymer. The flame retardant in an amount within the above range is expected to have good dispersibility in the composition and to improve the incombustibility of a film obtainable from the composition. Less than 1 part by mass of the flame retardant may fail to improve the incombustibility. More than 45 parts by mass thereof may have difficulty in maintaining the physical properties of the composition and the film. The amount of the flame retardant is more preferably 30 parts by mass or less, still more preferably 20 parts by mass or less, particularly preferably 15 parts by mass or less, relative to 100 parts by mass of the fluorine-containing polymer. The amount thereof is more preferably 3 parts by mass or more, still more preferably 5 parts by mass or more.

For the flame retardant which is the phosphorus- and nitrogen-containing composition (A), the amount thereof is preferably 8 to 19 parts by mass relative to 100 parts by mass of the fluorine-containing polymer. The amount of the phosphorus- and nitrogen-containing composition (A) is more preferably 9 parts by mass or more, still more preferably 10 parts by mass or more, while more preferably 17 parts by mass or less, still more preferably 15 parts by mass or less, relative to 100 parts by mass of the fluorine-containing polymer.

For the flame retardant which is the mixture (B) of a bromine-containing compound and an antimony-containing compound, the amount of the bromine-containing compound is preferably 1 to 30 parts by mass and the amount of the antimony-containing compound is preferably 0.5 to 15 parts by mass each relative to 100 parts by mass of the fluorine-containing polymer. The amount of the bromine-containing compound is more preferably 3 parts by mass or more, still more preferably 5 parts by mass or more, while more preferably 20 parts by mass or less, still more preferably 15 parts by mass or less, relative to 100 parts by mass of the fluorine-containing polymer. The amount of the antimony compound is more preferably 1.5 parts by mass or more, still more preferably 2.5 parts by mass or more, while more preferably 10 parts by mass or less, still more preferably 7.5 parts by mass or less, relative to 100 parts by mass of the fluorine-containing polymer.

The composition may be either a coating or a molding material. The composition may be in any form, such as liquid, powder, or pellets.

The composition can be molded into a film by extrusion molding or casting, for example. Further, application of the composition to a substrate can provide a coat on the substrate.

For the composition containing a curable functional group-containing fluorine-containing polymer as the fluorine-containing polymer, the polyol compound, an organic solvent, and a curing agent, application of the composition to a substrate and curing thereof can provide a cured coat on the substrate.

For the composition containing PVF or PVDF as the fluorine-containing polymer, the polyol compound, and an organic solvent, casting of the composition on a substrate, drying thereof, and peeling of the resulting layer from the substrate can provide a film.

The composition may be directly applied to a substrate such as metal, concrete, or plastic, or may be applied over an undercoat (e.g., wash primer, anticorrosive coating, epoxy coating, acrylic resin coating, or polyester resin coating) or over a stack of undercoat/intermediate coat as a coating for interior materials such as building materials and interior finishing materials or for outside materials such as building materials and materials for automobiles, aircraft, shipping (decks and ship bottoms), trains, tanks, and bridges. The composition may also be used as a sealant or a film-forming agent.

The composition or the film obtainable from the composition can suitably be applied to a substrate made of metal, concrete, plastic, stone, wood, paper, or other material. The composition or the film may also suitably be applied to a substrate with a primer layer or an undercoat layer in between. The primer may be a known primer, such as an epoxy primer or a zinc-rich primer. The coating for forming the undercoat may be an acrylic coating, a urethane coating, a polyester coating, or an epoxy coating, for example.

The composition may also be used as a coating agent for solar cell back and front sheets or golf balls, or an antifouling coat or coating (a coat on which fouling is less likely to deposit outside or a coating which enables easy removal of fouling), an algicidal coat or coating, or an antimicrobial coat or coating.

The invention also relates to a laminate including a water-impermeable sheet and a layer formed from the above composition.

The layer formed from the above composition may be formed by applying the above composition to a water-impermeable sheet, or may be formed by molding the above composition into a film and then stacking the film on a water-impermeable sheet. The layer formed from the above composition may be disposed on only one side or both sides of the water-impermeable sheet.

The water-impermeable sheet and the layer formed from the above composition may be directly bonded to each other, or may be bonded with another layer such as a primer layer in between. Still, since the layer formed from the above composition exhibits excellent adhesiveness to the water-impermeable sheet, it can directly be bonded thereto. Direct bonding between the water-impermeable sheet and the layer formed from the above composition enables weight reduction of the laminate.

The water-impermeable sheet is a layer disposed so as to prevent permeation of moisture to the encapsulant and the solar cell, and may be formed from any material substantially preventing permeation of water. From the viewpoints of factors such as weight, price, and flexibility, polyethylene terephthalate (PET) sheets, $SiO_x$-deposited PET sheets, and metal thin sheets of aluminum or stainless steel are often used. In particular, very often used are PET sheets. The thickness thereof is usually about 50 to 250 μm. $SiO_x$-deposited PET sheets are often used for cases requiring especially moisture proofing. The thickness thereof is usually about 10 to 20 μm.

In order to improve the adhesiveness to a layer formed from the composition, the water-impermeable sheet may be subjected to a conventionally known surface treatment. Examples of the surface treatment include corona discharge treatment, plasma discharge treatment, and passivation, and, for metal sheets, blast treatment.

The laminate can be used for building materials, interior materials, automobiles, aircraft, shipping (decks and ship bottoms), trains, tanks, and bridges. In particular, the laminate is preferably used as a back sheet for a solar cell module.

The back sheet may be used in the state of adhering to an encapsulant layer of a solar cell module. For the back sheet including a layer formed from the composition on one side of the water-impermeable sheet, the water-impermeable sheet and the encapsulant layer may be bonded to each other, or the layer formed from the composition and the encapsulant layer may be bonded to each other. Preferably, the layer formed from the composition and the encapsulant layer are bonded to each other because the layer formed from the composition exhibits excellent adhesiveness to the water-impermeable sheet and excellent adhesiveness to the encapsulant layer. Also, preferably, the layer formed from the composition is placed on the outermost surface of the solar cell module because the layer formed from the composition has excellent weather resistance. Accordingly, the back sheet preferably includes the layer formed from the composition on each side of the water-impermeable sheet.

The encapsulant layer is formed from an encapsulant and encapsulates the solar cell therein. Examples of the encapsulant include ethylene/vinyl acetate copolymers (EVA), polyvinyl butyral (PVB), silicone resin, epoxy resin, and acrylic resin. Preferred is EVA.

A solar cell module including the encapsulant layer and the laminate (back sheet) is also one aspect of the invention. This structure enables secure protection of the solar cell encapsulated in the encapsulant layer. In particular, in the laminate including a layer formed from the above composition on each side of the water-impermeable sheet, the layers are firmly bonded to each other and the layer formed from the above composition exhibits excellent weather resistance. Thus, the laminate can protect the solar cell for a long time.

Figure 2:
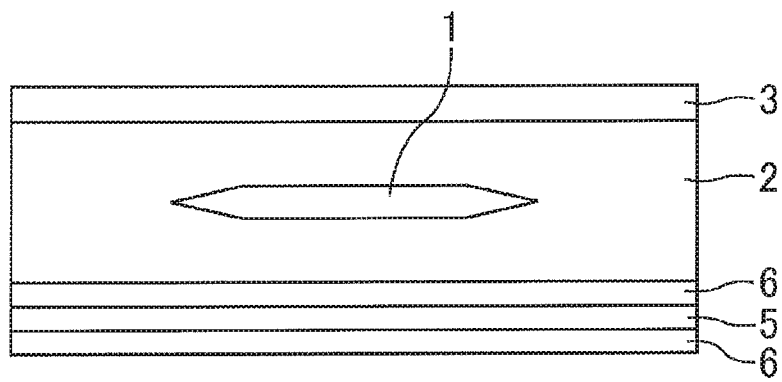
FIG. 2 is a schematic cross-sectional view of a second structure of a solar cell module.
Figure 3:
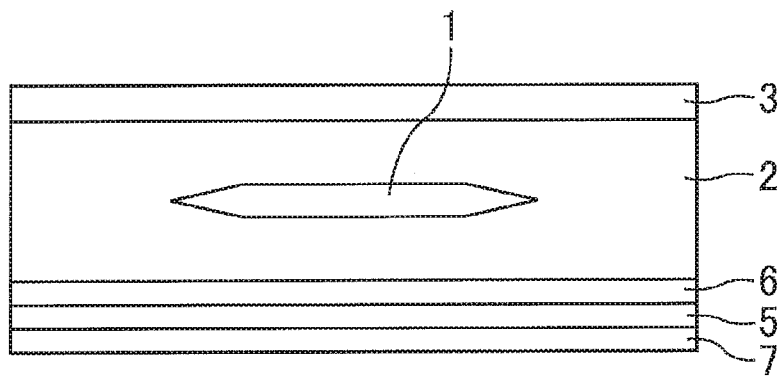
FIG. 3 is a schematic cross-sectional view of a third structure of a solar cell module.

Examples of a preferred structure of the solar cell module include those illustrated in FIGS. 1 to 3.

In a first structure illustrated in FIG. 1, a solar cell 1 is encapsulated in an encapsulant layer 2, and the encapsulant layer 2 is disposed between a surface layer 3 and a back sheet 4. The back sheet 4 includes a water-impermeable sheet 5 and a layer 6 formed from the composition. In this first structure, the layer 6 formed from the composition is disposed only on the side of the encapsulant layer 2.

The encapsulant layer 2 is formed from an ethylene/vinyl acetate copolymer (EVA), polyvinyl butyral (PVB), silicone resin, epoxy resin, or acrylic resin, for example.

The surface layer 3 is usually a glass plate, and may be a flexible material such as a resin sheet.

A second structure illustrated in FIG. 2 is a trilayer structure including the layer 6 formed from the composition disposed on each side of the water-impermeable sheet 5.

Although the back sheet of this second structure has an increased thickness, this structure has both the adhesiveness owing to the layer 6 formed from the composition on the side of the encapsulant layer 2 and the weather resistance owing to the layer 6 formed from the composition on the side opposite to the encapsulant layer 2.

The back sheet having a trilayer structure may include a water-impermeable sheet, a layer formed from the composition on one side of the water-impermeable sheet, and a layer different from the layer formed from the composition on the other side thereof.

A third structure illustrated in FIG. 3 is a structure including the layer 6 formed from the composition on the side of the encapsulant layer 2 of the water-impermeable sheet 5 and a different film 7 on the side opposite to the encapsulant layer 2.

The material of the film 7 may be a film formed from a fluorine-containing polymer coating free from a curable functional group, a fluorine-containing polymer sheet, a polyester sheet, or a film formed from a polyester coating.

In order to further improve the adhesiveness between the film and the encapsulant layer, the film may be subjected to a conventionally known surface treatment. Examples of the surface treatment include corona discharge treatment, plasma discharge treatment, passivation, and blast treatment.

Examples of the film formed from a fluorine-containing polymer coating free from a curable functional group include a film formed from a coating containing PVdF mixed with a tetraalkoxysilane or a partially hydrolyzed product, thereof disclosed in JP 2004-214342 A, a film formed from a coating mixture of a VdF/TFE/CTFE copolymer and an alkoxysilane unit-containing acrylic resin, a film formed from a coating mixture of a VdF/TFE/HFP copolymer and a hydroxy-containing acrylic resin, and a film formed from a coating containing a VdF/HFP copolymer mixed with an aminosilane-coupling agent. In order to achieve good opacity, weather resistance, chemical resistance, and moisture resistance, the film preferably usually has a thickness of 5 to 300 µm. The thickness is more preferably 10 to 100 µm, still more preferably 10 to 50 µm. Also, in this case, different layers such as an adhesive layer and a primer layer may be disposed.

Examples of the fluorine-containing polymer sheet include fluorine-containing polymer sheets used in current back sheets, such as PVdF sheets, PVF sheets, PCTFE sheets, TFE/HFP/ethylene copolymer sheets, TFE/HFP copolymer (PEP) sheets, TEE/PAVE copolymer (PFA) sheets, ethylene/TFE, copolymer (ETFE) sheets, and ethylene/CTFE copolymer (ECTFE) sheets. In order to achieve good weather resistance, the thickness is preferably usually 5 to 300 µm. The thickness is more preferably 10 to 100 µm, still more preferably 10 to 50 µm.

The polyester sheet may be one as it is used in conventional back sheets, and can be bonded to the water-impermeable sheet 5 using an acrylic adhesive, urethane adhesive, epoxy adhesive, or polyester adhesive, for example. In order to achieve good weather resistance, low cost, and good transparency, the polyester sheet preferably usually has a thickness of 5 to 300 µm. The thickness is more preferably 10 to 100 µm, still more preferably 10 to 50 µm.

Examples of the polyester coating include those containing a saturated polyester resin formed from a polycarboxylic acid and a polyhydric alcohol, and those containing an unsaturated polyester resin formed from a maleic or fumaric anhydride and a glycol. The polyester coating can form a film by, for example, roll coating, curtain coating, spray coating, die coating, or other coating technique. In order to achieve good opacity, weather resistance, chemical resistance, and moisture resistance, the film preferably has a thickness of 5 to 300 µm. The thickness is more preferably 10 to 100 µm, still more preferably 10 to 50 µm. Also, in this case, different layers such as an adhesive layer and a primer layer may be disposed.

EXAMPLES

The invention is described hereinbelow referring to, but not limited to, examples.

The parameters in the examples were determined by the following methods.

The PET adhesiveness and the EVA adhesiveness were determined before and after corona discharge treatment on the surface of the back sheet. The PET adhesiveness herein means the adhesiveness between the coat or film and the water-impermeable sheet (hereinafter, also referred to simply as "PET") formed from polyethylene terephthalate (PET) in the back sheet. The EVA adhesiveness herein means the adhesiveness between the coat or film of the back sheet and an EVA resin sheet (hereinafter, also referred to simply as "EVA").

A measurement sample was produced by the following procedure. An EVA resin sheet (SOLAR EVA, Mitsui Chemicals Fabro, Inc., thickness: 600 µm) was placed on the coat or film of the back sheet, and a glass (thickness: 3.2 mm) was placed on the EVA resin sheet. The layers were compression-bonded to each other at a pressure of 100 g/cm$^2$ and a temperature of 150° C. Thereby, a trilayer (glass/EVA/hack sheet) measurement sample before corona discharge treatment on the surface was produced.

The surface of the coat or film of the back sheet was subjected to corona discharge treatment, and then an EVA resin sheet (SOLAR EVA, Mitsui Chemicals Fabro, Inc., thickness: 600 µm) was placed on the coat or film and a glass (thickness: 3.2 mm) was placed on the EVA resin sheet. The layers were compression-bonded to each other at a pressure of 100 g/cm$^2$ and a temperature of 150° C. Thereby, a trilayer (glass/EVA/back sheet) measurement sample after corona discharge treatment on the surface was produced.

(Before Corona Discharge Treatment on Surface)

EVA adhesiveness: The adhesiveness was determined by a peeling test.

The EVA/back sheet portion of the measurement sample was provided with a cut with a size of 1 cm in width×15 cm in length. The sample was then subjected to a 180-degree peeling test using TENSILON (Orientec Co., Ltd.). Thereby, the bond strength between the EVA resin sheet and the back sheet was measured in terms of N/cm.

(After Corona Discharge Treatment on Surface)

PET adhesiveness and EVA adhesiveness: The adhesivenesses were determined by a peeling test.

The EVA/back sheet portion of the measurement sample was provided with a cut with a size of 1 cm in width×15 cm in length. The sample was then subjected to a 180-degree peeling test using TENSILON (Orientec Co., Ltd.). Thereby, the bond strength between EVA/back sheet was measured in terms of N/cm.

One object of this peeling test is to measure the peel strength between the EVA and the back sheet. In some of the measurement samples, the coat or film of the back sheet was broken during the peeling test, and thereafter the peeling between the coat or film and PET of the back sheet progressed. Thus, the peeling test was performed 10 times and the number of peelings between the coat or film and the PET was counted. The cases where the coats or films were not broken in all of the 10 peeling tests were evaluated that the number of peelings was 0. Further, samples with the coat or film being broken were subjected to measurement of the bond strength between the coat or film and the PET in terms of N/cm in addition to the peel strength between the EVA and the back sheet.

(Preparation 1)

Under stirring, 202 parts by mass of a butyl acetate solution (solid content: 65 mass %) containing a fluorine-containing polymer shown in Table 1, 263 parts by mass of titanium oxide (D918, Sakai Chemical industry Co., Ltd.) serving as white pigment, and 167 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the solution was further added 283 parts by mass of the fluorine containing polymer shown in Table 1 and 85 parts by mass of butyl acetate. Thereby, a composition I was prepared.

(Preparation 2)

Under stirring, 202 parts by mass of a butyl acetate solution (solid content: 65 mass %) containing a fluorine-containing polymer shown in Table 1, 263 parts by mass of titanium oxide (D918, Sakai Chemical Industry Co., Ltd.) serving as white pigment, and 167 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the solution was further added 283 parts by mass of the fluorine-containing polymer shown in Table 1 and 85 parts by mass of butyl acetate. Thereby, a composition 2 was prepared.

(Preparation 3)

Under stirring, 202 parts by mass of a butyl acetate solution (solid content: 65 mass %) containing a fluorine-containing polymer shown in Table 1, 263 parts by mass of titanium oxide (D918, Sakai. Chemical. Industry Co., Ltd.) serving as white pigment, and 167 parts by mass of butyl acetate were premixed, and then 632 parts by mass of 1.2-mm-diameter glass beads were added thereto. These components were dispersed using a pigment disperser at 1500 rpm for one hour. Thereafter, the glass beads were filtered out using a #80-mesh sieve. To the solution was further added 283 parts by mass of the fluorine-containing polymer shown in Table 1 and 85 parts by mass of butyl acetate. Thereby, a composition 3 was prepared, (Production 4)

First, 100 parts by mass of PVF pellets (DuPont) serving as resin, 30 parts by mass of titanium oxide D-918 (Sakai Chemical Industry Co., Ltd.) serving as white pigment, and 16 parts by mass of FLEXOREZ 148 (Kusumoto Chemicals, Ltd., hydroxyl value: 238, number average molecular weight: 500) serving as a polyol compound were molten and kneaded using a twin-screw extruder at 250° C. The mixture was then extrusion-molded into a film shape. Thereby, a 25-µm-thick film 4 was produced.

(Production 5)

First, 100 parts by mass of PVDF pellets (Daikin Industries, Ltd.) serving as resin, 30 parts by mass of titanium oxide D-918 (Sakai Chemical Industry Co., Ltd.) serving as white pigment, and 16 parts by mass of GI3000 (Nippon Soda Co., Ltd., hydroxyl value: 30, number average molecular weight: 3000) serving as a Polyol compound were molten and kneaded using a twin-screw extruder at 220° C. The mixture was then extrusion-molded into a film shape. Thereby, a 25-µm-thick film 5 was produced.

(Production 6)

First, 100 parts by mass of PVF pellets (DuPont) serving as resin and 30 parts by mass of titanium oxide D-918 (Sakai Chemical industry Co., Ltd.) serving as white pigment were molten and kneaded using a twin-screw extruder at 250° C. The mixture was then extrusion-molded into a film shape. Thereby, a. 25-µm-thick film 6 was produced.

(Production 7)

First, 100 parts by mass of PVDF pellets (Daikin Industries, Ltd.) serving as resin and 30 parts by mass of titanium oxide D-918 (Sakai Chemical Industry Co., Ltd.) serving as white pigment were molten and kneaded using a twin-screw extruder at 250° C. The mixture was then extrusion-molded into a film shape. Thereby, a 25-µm-thick film 7 was produced.

TABLE 1

|  |  | Preparation 1 | Preparation 2 | Preparation 3 |
|---|---|---|---|---|
| Composition of fluorine-containing polymer (mol %) | Tetrafluoroethylene | 44.0 |  | 45.0 |
|  | Chlorotrifluoroethylene |  | 45.0 |  |
|  | Vinylidene fluoride |  |  |  |
|  | Vinylidene fluoride |  |  |  |
|  | Vinyl acetate |  | 45.0 |  |
|  | Hydroxybutyl vinyl ether |  | 9.4 | 15.3 |
|  | Hydroxyethyl vinyl ether | 17.0 |  |  |
|  | Acrylic acid | 0.8 |  | 0.9 |
|  | Undecylenic acid |  | 0.6 |  |
|  | Crotozic acid |  |  |  |
|  | VeoVa 9 |  |  | 20.1 |
|  | VeoVa 10 | 38.2 |  | 13.3 |
|  | Vinyl benzoate |  |  | 5.5 |
| Number average molecular weight of fluorine-containing polymer |  | 13000 | 17000 | 13000 |

In the table, VeoVa 9 means vinyl versatate (trade name of C9 aliphatic vinyl carboxylate available from Shell Chemicals) and VeoVa 10 means vinyl versatate (trade name of C10 aliphatic vinyl carboxylate available from Shell Chemicals).

The polyol compounds used in the examples and the comparative examples are as follows.

1: FLEXOREZ 148 (Kusumoto Chemicals, Ltd., hydroxyl value: 238, number average molecular weight: 500)

2: FLEXOREZ A308 (Kusumoto Chemicals, Ltd., hydroxyl value: 216, number average molecular weight: 500)

3: UH50 (Ube Industries, Ltd., hydroxyl value: 224, number average molecular weight: 500)

4: GI3000 (Nippon Soda Co., Ltd., hydroxyl value: 30, number average molecular weight: 3000)

5: UM90 (⅓) (Ube Industries, Ltd., hydroxyl value: 125, number average molecular weight: 900)

The curing agent used in the examples and the comparative examples is the following.

6: Sumidur N3300 (Sumika Byer, NCO content: 21.8%)

Examples 1 to 10 and Comparative Examples 1 and 4

One of the compositions 1 to 3, one of the polyol compounds, and the curing agent were mixed to provide a coating. The types and amounts of the respective components are shown in Table 2. Next, a PET sheet (Lumirror SiO, Toray Industries, Inc., thickness: 250 μm) was prepared as a water-impermeable sheet, and the coating was applied to one side of this PET sheet using a coater such that the dry thickness of the film was 20 μm. The coating was then dried at 130° C. for five minutes. Thereby, a back sheet having a bilayer structure was produced. Table 2 shows the results.

Examples 11

A PET sheet (Lumirror S10, Toray Industries, Inc., thickness: 250 μm, sheet A) was prepared as a water-impermeable sheet, and the film 4 was laminated on one side thereof using a polyester adhesive. Thereby, a back sheet having a bilayer structure was produced. Table 2 shows the results.

Examples 12

A PET sheet (Lumirror S10, Toray Industries, Inc., thickness: 250 μm, sheet A) was prepared as a water-impermeable sheet, and the film 5 was laminated on one side thereof using a polyester adhesive. Thereby, a back sheet having a bilayer structure was produced. Table 2 shows the results.

Comparative Examples 2

A PET sheet (Lumirror S10, Toray Industries, Inc., thickness: 250 μm, sheet A) was prepared as a water-impermeable sheet, and the film 6 was laminated on one side thereof using a polyester adhesive. Thereby, a back sheet having a bilayer structure was produced. Table 2 shows the results.

Comparative Examples 3

A PET sheet (Lumirror S10, Toray Industries, Inc., thickness: 250 μm, sheet A) was prepared as a water-impermeable sheet, and the film 7 was laminated on one side thereof using a polyester adhesive. Thereby, a back sheet having a bilayer structure was produced. Table 2 shows the results.

TABLE 2

| | | Example 1 | Example 2 | Example 3 | Example 4 | Example 5 | Example 6 | Example 7 | Example 8 |
|---|---|---|---|---|---|---|---|---|---|
| | Type of fluorine-containing polymer | Comp. 3 | Comp. 3 | Comp. 3 | Comp. 3 | Comp. 3 | Comp. 3 | Comp. 3 | Comp. 3 |
| | Type of polyol compound | 1 | 1 | 1 | 1 | 2 | 3 | 4 | 5 |
| | Amount of polyol compound relative to 315 parts by mass of fluorine-containing polymer (parts by mass) | 50 | 100 | 200 | 300 | 50 | 50 | 50 | 50 |
| | Type of curing agent | 6 | 6 | 6 | 6 | 6 | 6 | 6 | 6 |
| | Amount of curing agent relative to 315 parts by mass of fluorine-containing polymer (parts by mass) | 111 | 153 | 237 | 321 | 106 | 107 | 74 | 90 |
| Before corona discharge treatment on surface | EVA adhesiveness (N/cm) | 20 | 18 | 17 | 16 | 12 | 28 | 32 | 26 |
| After corona discharge treatment on surface | EVA adhesiveness (N/cm) | 62 | 60 | 59 | 57 | 60 | 62 | 64 | 64 |
| | Number of peeling between film or coat and PET (times/10 times) | 1 | 4 | 5 | 5 | 4 | 0 | 0 | 0 |
| | Bond strength between film or coat and PET (N/cm) | 15 | 10 | 8 | 7 | 4 | — | — | — |

| | | Example 9 | Example 10 | Example 11 | Example 12 | Compar. Example 1 | Compar. Example 2 | Compar. Example 3 | Compar. Example 4 |
|---|---|---|---|---|---|---|---|---|---|
| | Type of fluorine-containing polymer | Comp. 1 | Comp. 2 | Film 4 | Film 5 | Comp. 3 | Film 6 | Film 7 | Comp. 3 |
| | Type of polyol compound | 1 | 1 | 1 | 4 | — | — | — | 1 |
| | Amount of polyol compound relative to 315 parts by mass of fluorine-containing polymer (parts by mass) | 50 | 50 | 50 | 50 | 0 | 0 | 0 | 315 |
| | Type of curing agent | 6 | 6 | — | — | 6 | — | — | 6 |
| | Amount of curing agent relative to 315 parts by mass of fluorine-containing polymer (parts by mass) | 116 | 95 | 0 | 0 | 69 | 0 | 0 | 334 |

TABLE 2-continued

| | | | | | | | | | |
|---|---|---|---|---|---|---|---|---|---|
| Before corona discharge treatment on surface | EVA adhesiveness (N/cm) | 19 | 17 | 10 | 12 | 5 | 2 | 3 | 16 |
| After corona discharge treatment on surface | EVA adhesiveness (N/cm) | 59 | 54 | 30 | 30 | 45 | 21 | 32 | 54 |
| | Number of peeling between film or coat and PET (times/10 times) | 1 | 0 | 0 | 0 | 8 | 0 | 0 | 6 |
| | Bond strength between film or coat and PET (N/cm) | 14 | — | — | — | 2 | — | — | 6 |

REFERENCE SIGNS LIST

1: Solar cell
2: Encapsulant layer
3: Surface layer
4: Back sheet (laminate)
5: Water-impermeable sheet
6: Layer formed from composition of the invention
7: Different film

The invention claimed is:

1. A structure comprising:
   a plastic substrate and
   a composition or a film obtained from the composition that has been applied to the plastic substrate;
   the composition comprising:
   a fluorine-containing polymer; and
   a polyol compound having a hydroxyl value of 10 to 300 and a number average molecular weight of 300 to 4000,
   the polyol compound being contained in an amount of not less than 0.1 mass % but less than 100 mass % relative to the fluorine-containing polymer,
   wherein the fluorine-containing polymer is at least one selected from the group consisting of curable functional group-containing fluorine-containing polymers, polyvinyl fluoride, and polyvinylidene fluoride,
   wherein the curable functional group-containing fluorine-containing polymer contains a polymerized unit based on a fluorine-containing monomer and a polymerized unit based on a hydroxy-containing vinyl ether,
   wherein the polyvinyl fluoride and the polyvinylidene fluoride are free from a curable functional group, and
   wherein the polyol compound is at least one selected from the group consisting of polyester polyols, polycarbonate polyols, polyether polyols, and polybutadiene polyols.

2. The structure according to claim 1,
   wherein the amount of the polyol compound is 0.1 to 50 mass % relative to the fluorine-containing polymer.

3. The structure according to claim 1, the composition further comprising a curing agent.

4. A laminate comprising:
   a water-impermeable sheet; and
   a layer formed from a composition comprising:
   a fluorine-containing polymer; and
   a polyol compound having a hydroxyl value of 10 to 300 and a number average molecular weight of 300 to 4000,
   the polyol compound being contained in an amount of not less than 0.1 mass % but less than 100 mass % relative to the fluorine-containing polymer,
   wherein the fluorine-containing polymer is at least one selected from the group consisting of curable functional group-containing fluorine-containing polymers, polyvinyl fluoride, and polyvinylidene fluoride,
   wherein the curable functional group-containing fluorine-containing polymer contains a polymerized unit based on a fluorine-containing monomer and a polymerized unit based on a hydroxy-containing vinyl ether,
   wherein the polyvinyl fluoride and the polyvinylidene fluoride are free from a curable functional group, and
   wherein the polyol compound is at least one selected from the group consisting of polyester polyols, polycarbonate polyols, polyether polyols, and polybutadiene polyols.

5. The laminate according to claim 4, which is a back sheet for a solar cell module.

6. A solar cell module comprising:
   an encapsulant layer; and
   the laminate according to claim 4.

7. The structure according to claim 1, wherein the polyol compound is at least one selected from the group consisting of polycarbonate polyols and polybutadiene polyols.

8. The laminate according to claim 4, wherein the polyol compound is at least one selected from the group consisting of polycarbonate polyols and polybutadiene polyols.

* * * * *